US008975168B2

(12) United States Patent
Liu et al.

(10) Patent No.: US 8,975,168 B2
(45) Date of Patent: Mar. 10, 2015

(54) METHOD FOR THE FORMATION OF FIN STRUCTURES FOR FINFET DEVICES

(71) Applicant: STMicroelectronics, Inc., Coppell, TX (US)

(72) Inventors: Qing Liu, Guilderland, NY (US); Nicolas Loubet, Guilderland, NY (US)

(73) Assignee: STMicroelectronics, Inc., Coppell, TX (US)

( * ) Notice: Subject to any disclaimer, the term of this patent is extended or adjusted under 35 U.S.C. 154(b) by 42 days.

(21) Appl. No.: 13/903,630

(22) Filed: May 28, 2013

(65) Prior Publication Data

US 2014/0357060 A1    Dec. 4, 2014

(51) Int. Cl.
*H01L 21/20* (2006.01)
*H01L 21/36* (2006.01)
*H01L 21/00* (2006.01)
*H01L 21/02* (2006.01)

(52) U.S. Cl.
CPC .... *H01L 21/02664* (2013.01); *H01L 21/02381* (2013.01); *H01L 21/02532* (2013.01)
USPC ............................. 438/479; 438/507; 438/149

(58) Field of Classification Search
None
See application file for complete search history.

(56) References Cited

U.S. PATENT DOCUMENTS

| | | | |
|---|---|---|---|
| 6,645,797 B1 | 11/2003 | Buynoski et al. | |
| 7,078,299 B2 * | 7/2006 | Maszara et al. | 438/285 |
| 7,095,081 B2 * | 8/2006 | Yamada et al. | 257/347 |
| 7,229,867 B2 | 6/2007 | Skotnicki et al. | |
| 7,498,216 B2 * | 3/2009 | Nowak | 438/198 |
| 7,592,209 B2 * | 9/2009 | Chang | 438/149 |
| 7,638,843 B2 * | 12/2009 | Xiong et al. | 257/347 |
| 7,781,315 B2 | 8/2010 | Lenoble | |
| 7,993,999 B2 * | 8/2011 | Basker et al. | 438/199 |
| 8,039,843 B2 * | 10/2011 | Inaba | 257/64 |
| 8,486,770 B1 * | 7/2013 | Wu et al. | 438/142 |
| 8,492,839 B2 * | 7/2013 | Doris et al. | 257/347 |
| 8,610,201 B1 * | 12/2013 | Hokazono | 257/328 |
| 8,815,659 B2 * | 8/2014 | Chi et al. | 438/157 |
| 8,841,178 B1 * | 9/2014 | Basker et al. | 438/157 |
| 2007/0069302 A1 * | 3/2007 | Jin et al. | 257/369 |
| 2007/0190708 A1 * | 8/2007 | Kaneko et al. | 438/157 |
| 2008/0111190 A1 * | 5/2008 | Chang | 257/350 |
| 2008/0227241 A1 * | 9/2008 | Nakabayashi et al. | 438/150 |
| 2008/0272433 A1 * | 11/2008 | Alshareef et al. | 257/347 |
| 2010/0065914 A1 * | 3/2010 | Lin | 257/369 |

* cited by examiner

*Primary Examiner* — Scott B Geyer
(74) *Attorney, Agent, or Firm* — Gardere Wynne Sewell LLP

(57) ABSTRACT

A SOI substrate layer formed of a silicon semiconductor material includes adjacent first and second regions. A portion of the silicon substrate layer in the second region is removed such that the second region retains a bottom portion made of the silicon semiconductor material. An epitaxial growth of a silicon-germanium semiconductor material is made to cover the bottom portion. Germanium is then driven from the epitaxially grown silicon-germanium material into the bottom portion to convert the bottom portion to silicon-germanium. Further silicon-germanium growth is performed to define a silicon-germanium region in the second region adjacent the silicon region in the first region. The silicon region is patterned to define a first fin structure of a FinFET of a first (for example, n-channel) conductivity type. The silicon-germanium region is also patterned to define a second fin structure of a FinFET of a second (for example, p-channel) conductivity type.

22 Claims, 13 Drawing Sheets

METHOD FOR THE FORMATION OF FIN STRUCTURES FOR FINFET DEVICES

TECHNICAL FIELD

The present invention relates to integrated circuits and, in particular, to a process for the formation of fin structures for use in FinFET-type integrated circuit devices.

BACKGROUND

The prior art teaches the formation of integrated circuits which utilize one or more FinFET type field effect transistors. The FinFET transistor comprises a channel region which is oriented to conduct an electrical current parallel to the surface of the substrate. The channel region is provided in an elongated section of semiconductor material. The source and drain regions of the transistor are formed in the elongated section on either side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions which are separated from each other by an intermediate gate portion of the transistor gate spanning with a perpendicular orientation over the multiple elongated sections.

A FinFET transistor is created from at least one thin portion (referred to as the "fin") of semiconductor material defining the elongated section which is used to form the channel of the transistor and also its source and drain zones. This fin is typically defined by a mask that is formed on top of a monocrystalline silicon substrate at the position of the fin. The substrate material is then directionally etched where there is no mask, to a determined depth, such that the elongated section defining the fin remains under the mask and is composed of the substrate material.

In one prior art implementation, the fin of semiconductor material which is thus obtained, and which comprises the channel of the final transistor, is not electrically insulated from the active portion of the circuit substrate, which itself is also of crystalline semiconductor material. Such a FinFET device suffers from three distinct types of leakage current. A first type of leakage current can circulate between the source and drain of the finFET transistor, via the active portion of the substrate situated below the channel. This first leakage current, internal to each transistor, is not controlled by the potential applied to the transistor gate. A second type of leakage current arises because the channel of the finFET transistor is also in electrical contact with the channels of other transistors of the same conductivity type via the substrate. The second leakage current flows between transistors in the form of an inter-transistor leakage current. A third type of leakage current appears between the channel of each finFET transistor and a lower part of the substrate in response to the substrate being connected to a reference potential.

To avoid these leakage currents, it is known in the art to instead fabricate the FinFET transistor on an integrated circuit substrate which is of the Silicon-on-Insulator (SOI) type. Such an SOI substrate comprises, in a lower part, an intermediate layer of electrically insulating material which is topped by a crystalline silicon layer. Reference is made to U.S. Pat. No. 6,645,797, the disclosure of which is incorporated by reference, which teaches a process for realizing a FinFET transistor from an SOI substrate. The transistor which is obtained is electrically insulated from the lower part of the substrate by the intermediate layer of insulating material, and thus leakage current concerns are reduced.

The FinFET transistor implemented on an SOI substrate is considered by those skilled in the art as an attractive option for use in connection with circuits fabricated at aggressively scaled process technology nodes, and in particular is well suited for use in CMOS integrated circuit designs. Superior short channel control along with higher performance in comparison to conventional planar bulk devices are recognized as advantages associated with the selection of the FinFET for CMOS circuits.

However, as CMOS process technology continues to scale towards smaller and smaller dimensions, further improvement in transistor performance is needed. Those skilled in the art recognize that the use of silicon-germanium (SiGe) materials for transistor fabrication provide for a significant boost in transistor performance, especially with respect to p-channel field effect transistor devices. Indeed, the art is moving towards the use of SiGe for p-channel devices implemented in both bulk device technology and SOI technology. Specific to the use of FinFET devices, those skilled in art recognize a need to form the fin of the p-channel device from a SiGe material in order to reach improved transistor performance levels over prior art Si material only devices.

The formation of a SiGe fin for a FinFET device is not without challenge. Fabrication techniques known in the art for SiGe fabrication use an extensive thermal budget. These thermal treatments can cause germanium to diffuse from the substrate regions where p-channel devices are being fabricated. This is of particular concern in connection with the fabrication of CMOS circuitry as the Ge from the SiGe material may diffuse into the adjacent substrate regions where n-channel devices are being fabricated and adversely affect the performance of the n-channel devices. To address the issue of Ge diffusion, a different fabrication technique forms the SiGe fins (for the p-channel devices) after the Si fins (for the n-channel devices) have been defined. However, such devices suffer from a concern over non-uniform fin shape due to the difficulty of forming a uniform SiGe epitaxy around the fin.

There is accordingly a need in the art for a fin fabrication process that does not suffer from the foregoing problems.

SUMMARY

In an embodiment, a method comprises: in a substrate layer formed of a first semiconductor material and having a first region which is adjacent to a second region, removing a portion of first semiconductor material of the substrate layer in the second region, said second region retaining a bottom portion made of said first semiconductor material; epitaxially growing a second semiconductor material covering the bottom portion; converting the bottom portion made of said first semiconductor material into said second semiconductor material so that the first region is defined by the first semiconductor material and second region is defined by the second semiconductor material; patterning the first semiconductor material in the first region to define a first fin structure of a FinFET transistor of a first conductivity type; and patterning the second semiconductor material in the second region to define a second fin structure of a FinFET transistor of a second conductivity type.

In an embodiment, a method comprises: in a substrate layer formed of a first semiconductor material and having a first region which is adjacent to a second region, removing a portion of first semiconductor material of the substrate layer in the second region to define a side wall, said second region retaining a bottom portion made of said first semiconductor material; first epitaxially growing a second semiconductor material covering the side wall and the bottom portion in the second region; conformally depositing an oxide layer over the second semiconductor material; applying a thermal treatment to convert the first semiconductor material at the side wall and bottom portion to the second semiconductor material; removing the oxide layer; second epitaxially growing the second semiconductor material in the second region from the first epitaxially grown second semiconductor material and converted bottom portion so that the first region is defined by the first semiconductor material and second region is defined by the second semiconductor material; patterning the first semiconductor material in the first region to define a first fin structure of a FinFET transistor of a first conductivity type; and patterning the second semiconductor material in the second region to define a second fin structure of a FinFET transistor of a second conductivity type.

In an embodiment, a method comprises: in a substrate layer formed of a first semiconductor material and having a first region which is adjacent to a second region, removing a portion of first semiconductor material of the substrate layer in the second region to define a side wall, said second region retaining a bottom portion made of said first semiconductor material; forming a spacer on said side wall; first epitaxially growing a second semiconductor material on the bottom portion in the second region; conformally depositing an oxide layer over the second semiconductor material; applying a thermal treatment to convert the first semiconductor material of the bottom portion to the second semiconductor material; removing the oxide layer; second epitaxially growing the second semiconductor material in the second region from the first epitaxially grown second semiconductor material and converted bottom portion so that the first region is defined by the first semiconductor material and second region is defined by the second semiconductor material, and wherein said spacer separates the second semiconductor material in the second region from the first semiconductor material in the first region; patterning the first semiconductor material in the first region to define a first fin structure of a FinFET transistor of a first conductivity type; and patterning the second semiconductor material in the second region to define a second fin structure of a FinFET transistor of a second conductivity type.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-12 which illustrate the process steps in the formation of fins for a FinFET device on a Silicon-on-Insulator (SOI) substrate.

Figure 1:
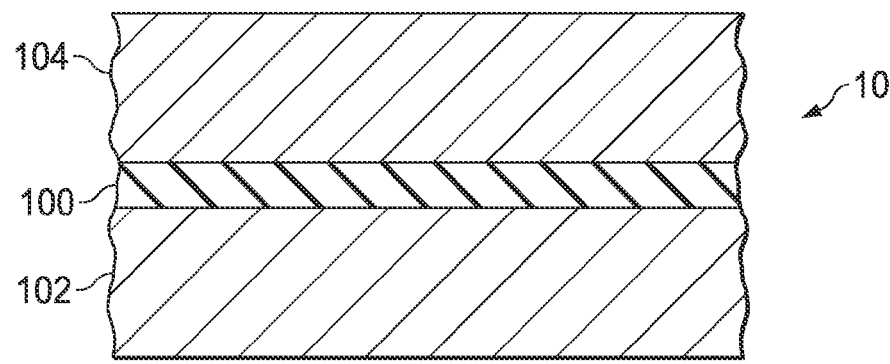
FIGS. 1-12 illustrate process steps in the formation of fins for a FinFET device on a Silicon-on-Insulator (SOI) substrate.

FIG. 1 shows a conventional silicon-on-insulator (SOI) substrate 10 formed by insulator layer 100 of silicon dioxide formed on a first silicon (Si) layer 102. A second silicon (Si) layer 104 is formed over the insulator layer 100. In a preferred implementation, the SOI substrate 10 is of the partially-depleted (PD) type (i.e., the substrate 10 comprises PD SOI as known in the art). The first and second silicon layers 102 and 104 may be doped as needed for the integrated circuit application. The thickness of the first and second silicon layers 102 and 104 may be tuned (for example, through the use of a thinning operation) as needed for the integrated circuit application. In a preferred implementation, the second silicon (Si) layer 104 has a thickness of about 20-40 nm, and more particularly about 30 nm, which is the preferred height of the fin structures being formed for FinFET devices. Although a PD SOI is preferred, it will be understood that other types of SOI substrates, including fully depleted (FD), could instead be used. Still further, the substrate may alternatively comprise a non-SOI substrate.

Figure 2:
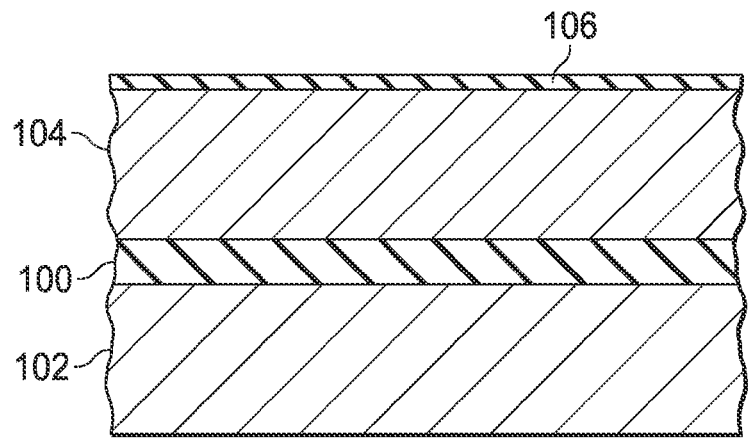

FIG. 2 shows the deposit of a silicon dioxide ($SiO_2$) layer 106 over the second silicon (Si) layer 104.

Figure 3:
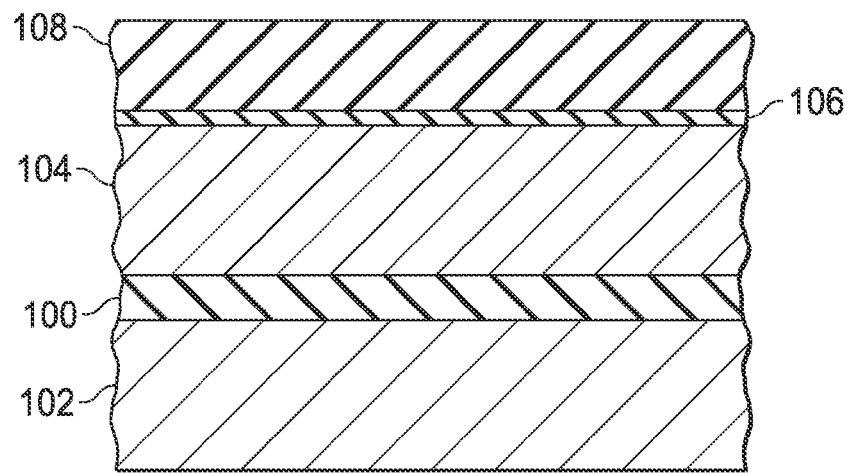

FIG. 3 shows the deposit of a silicon nitride (SiN) layer 108 over the silicon dioxide layer 106.

Figure 4:
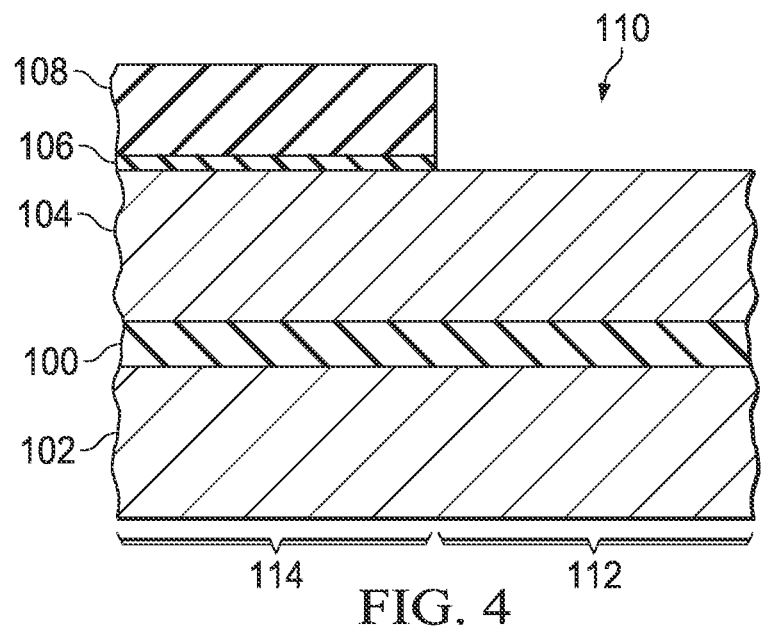

A lithographic process as known in the art is then used to form an opening 110 in the silicon nitride layer 108 and silicon dioxide layer 106 (a $SiN/SiO_2$ hard mask) which extends down to reach at least the top surface of the second silicon (Si) layer 104. The result of the lithographic process is shown in FIG. 4. The opening 110 is associated with a region 112 of the substrate reserved for the formation of p-channel FinFET devices. The region 114 of the substrate is conversely reserved for the formation of n-channel FinFET devices. Thus, the process described and illustrated primarily concerns the formation of CMOS type integrated circuits, although it will be understood that this is not the only application of the described process. In plan view, the opening 110 may take on any desired shape governed by the size and number of p-channel devices to be formed within the region 112.

Figure 5:
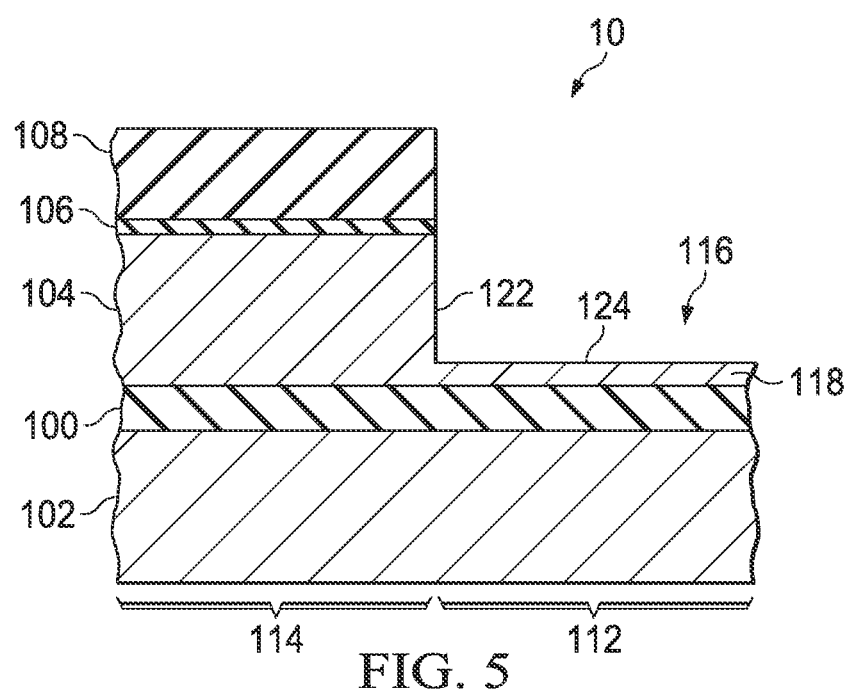

Using an epitaxial process tool, a high pressure directional etch process as known in the art is then performed to remove a portion 116 of the second silicon (Si) layer 104 within the region 112. In an embodiment, the directional etch may comprise a high pressure HCl etch. The result of the directional etch process is shown in FIG. 5. It will be noted that a portion 118 of the second silicon (Si) layer 104 remains in the region 112 after the directional etch is completed. The thickness of the remaining Si portion 118 in region 112 is about 5 nm to 15 nm.

Figure 6:
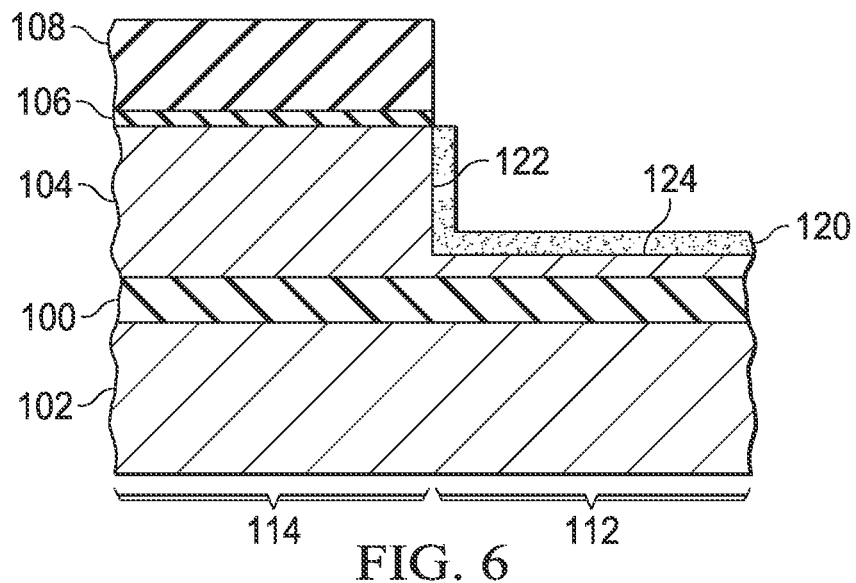

Without removing the substrate 10 from the epitaxial process tool used for the etch of FIG. 5, an epitaxial growth process as known in the art is then performed to grow a silicon-germanium (SiGe) layer 120 on the exposed surfaces 122 and 124 of the second silicon (Si) layer 104. The result of the epitaxial growth process is shown in FIG. 6. The stippling in FIG. 6 is provided to differentiate SiGe material from Si material. The thickness of the silicon-germanium (SiGe) layer 120 in region 112 is about 6 nm to 8 nm.

Figure 7:
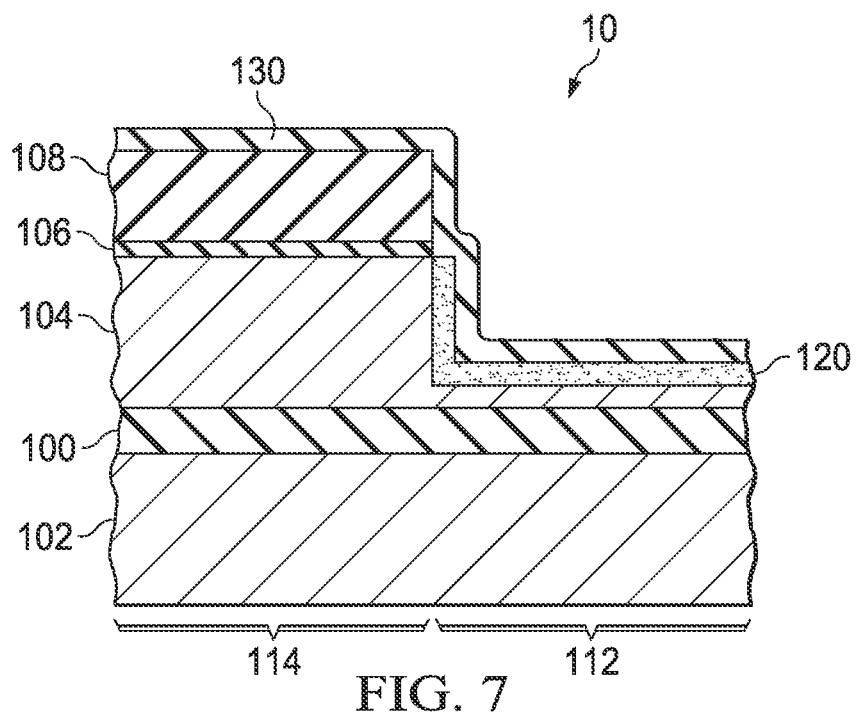

FIG. 7 shows the deposit of a silicon dioxide ($SiO_2$) layer 130 over the substrate 10. The silicon dioxide ($SiO_2$) layer 130 is conformally deposited and thus covers the top and side of the $SiN/SiO_2$ hard mask and the silicon-germanium (SiGe) layer 120 within region 112.

Figure 8:
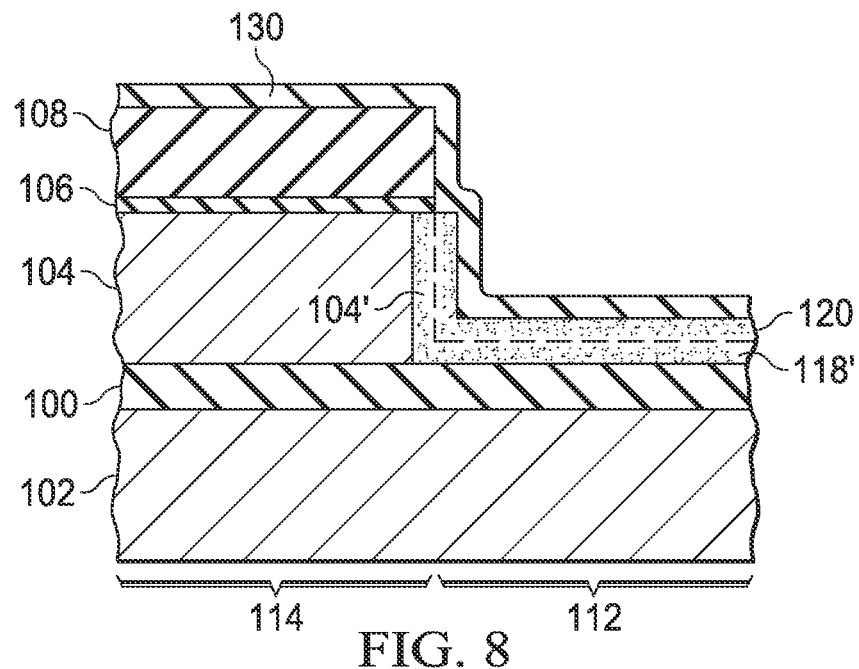

Next, a condensation operation, for example of the rapid thermal oxidation (RTO) type, is performed to drive the Ge from the silicon-germanium (SiGe) layer 120 into the second silicon (Si) layer 104. In particular, the drive-in converts the portion 118 of the second silicon (Si) layer 104 which remained in the region 112 into a SiGe region 118'. The drive-in will also convert a portion of the second silicon (Si) layer 104 at the surface 122 into a SiGe region 104'. The result of the drive-in process is shown in FIG. 8. Again, the stippling in FIG. 8 is provided to differentiate SiGe material from Si material. The dotted line in FIG. 8 is provided to illustrate the previous locations of the surfaces 122 and 124 in relation to the formed SiGe region 118'.

As an alternative to performing the condensation operation for drive-in, a higher temperature anneal process may be performed to cause a mixing of the SiGe material of the silicon-germanium (SiGe) layer 120 with the portion 118 of the second silicon (Si) layer 104 which remained in the region 112.

With either process technique of condensation or anneal used for drive-in, it will be noted that only a small thickness (approximately 6-8 nm) of the second silicon (Si) layer 104 within the portion 118 needs to be changed from Si to SiGe. Thus, the thermal budget for this vertical diffusion processing operation is relatively limited.

It will be noted that there is some lateral Ge diffusion into the portion of the second silicon (Si) layer 104 at the surface 122 to form SiGe region 104' located in the region 114. The conversion of region 104' to SiGe is not, however, of concern because the lateral diffusion, like the vertical diffusion used to form SiGe region 118', is well below the minimum spacing requirements (about 20 nm as known in the art) between n-channel region 114 and p-channel region 112 necessary to support CMOS integrated circuitry.

Figure 9:
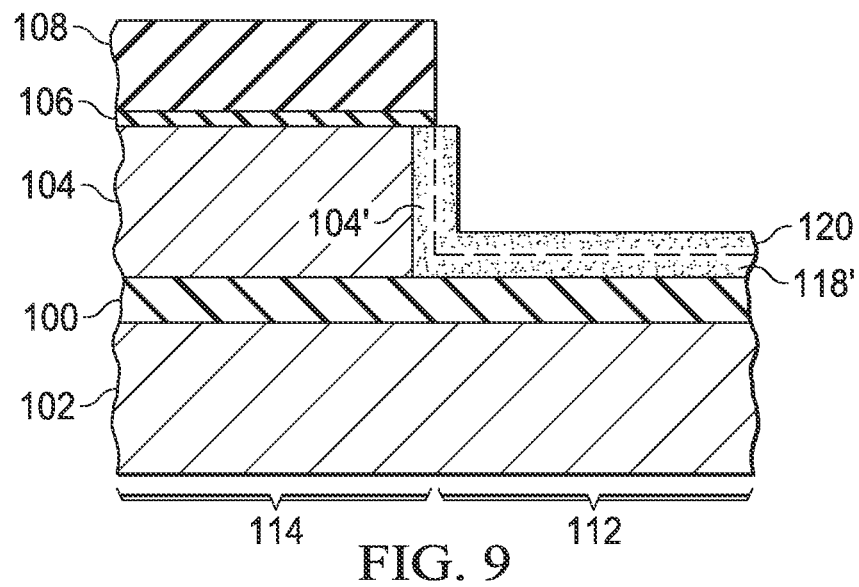

The silicon dioxide (SiO$_2$) layer 130 is then removed as shown in FIG. 9.

Figure 10:
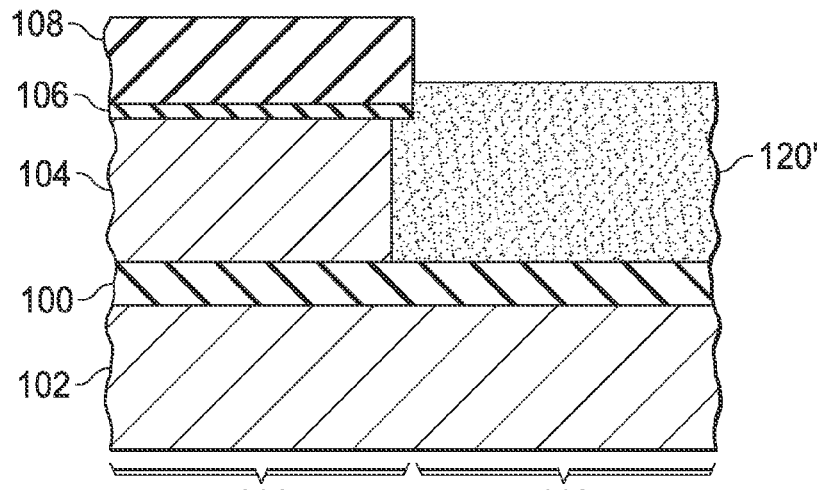

An epitaxial growth process as known in the art is then performed to grow a silicon-germanium (SiGe) region 120' from the SiGe material defined by the silicon-germanium (SiGe) layer 120, SiGe region 104' and SiGe region 118'. The result of the epitaxial growth process is shown in FIG. 10. Again, the stippling in FIG. 10 is provided to differentiate SiGe material from Si material. The epitaxial growth of SiGe region 120' in region 112 preferably achieves a depth equal to or exceeding the depth of the second silicon (Si) layer 104 in region 114. In a preferred implementation, a SiGe epitaxial growth of more than 20 nm is effectuated.

Figure 11:
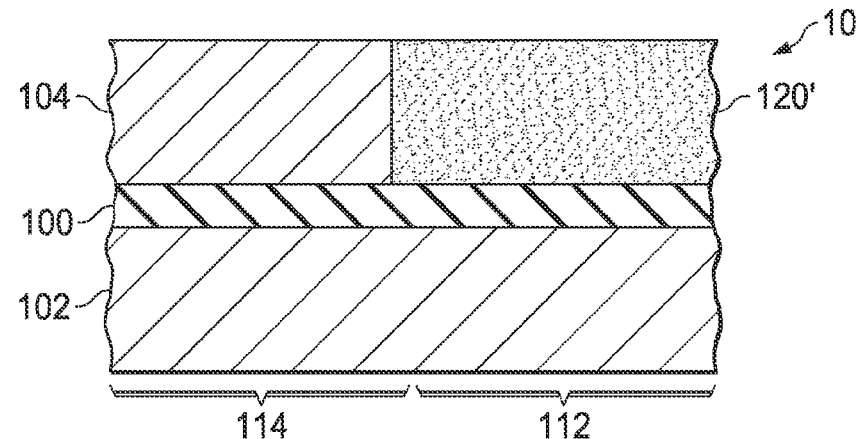

The SiN/SiO$_2$ hard mask is then removed and a planarization process (for example, chemical-mechanical polishing (CMP)), is used to flatten the top of the substrate 10 so as to equalize the depth of the silicon-germanium (SiGe) region 120' in region 112 and the depth of the second silicon (Si) layer 104 in region 114. This is shown in FIG. 11.

As an alternative, a well-defined thinner hardmask may be used with the thinner hardmask functioning as a stop layer for the CMP process. To support equalized depths in the first and second regions 112 and 114, a hot SC1 clean is performed to accurately remove some SiGe (for the depth of the thinner hardmask). The hardmask is then removed.

Figure 12:
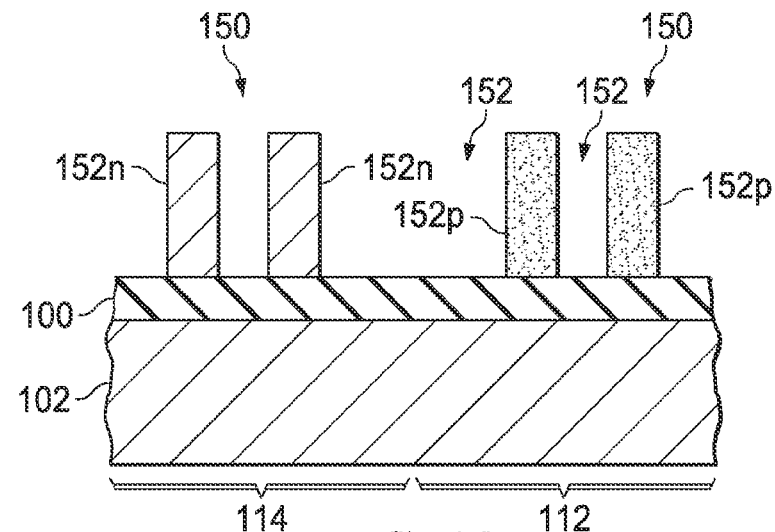

A lithographic process as known in the art is then used to define the fins 150 for the FinFET devices. A lithographic mask is applied over the top surface of the silicon-germanium (SiGe) region 120' in region 112 and the second silicon (Si) layer 104 in region 114. The mask is patterned to leave mask material at the desired locations of the fins 150. An etching operation is then performed to open apertures 152 in the silicon-germanium (SiGe) region 120' in region 112 and the second silicon (Si) layer 104 in region 114 on either side of each fin 150. The result of the etching process is shown in FIG. 12. Again, the stippling in FIG. 12 is provided to differentiate SiGe material from Si material. The fins 150 include fins 152$p$ for use in forming p-channel transistors in the region 112 fins and 152$n$ for use in forming n-channel transistors in the region 114. The etching process used to form the fins 150 may, for example, comprise a Cl$_2$ or HBr etch as known in the art.

It is preferred to perform SiGe epitaxial growth in two steps (FIG. 6 and FIG. 10) separated by the drive-in of Ge (FIG. 8) because this process produces a fin 150$p$ structure having a full and uniform SiGe material configuration.

Notwithstanding the foregoing, it will be understood that that SiGe epitaxial growth of FIG. 6 may be performed to a degree which grows SiGe material in region 112 to height at or exceeding the height of the second silicon (Si) layer 104 in region 114. This would optionally be followed by the deposit of a silicon dioxide (SiO$_2$) layer 130 (compare to FIG. 7) and a subsequent drive-in process (FIG. 8), and thus the SiGe growth step of FIG. 10 would not be performed. The potential problem with this alternate process is a non-uniformity in semiconductor material within the fin 150$p$ caused by the presence of both Si and SiGe in region 112. Such a non-uniformity in semiconductor material with respect to the fin 150$p$ will degrade p-channel transistor performance and introduce variabilities in transistor threshold. Additionally, because there is a lattice mismatch between Si and SiGe, the growth of a thick SiGe layer on top of Si can create dislocations at the bottom of the fin 150$p$, which may lead to leakage paths. Conversion of the portion 118 of the second silicon (Si) layer 104 remaining in the region 112 into a SiGe region 118' before thick SiGe epitaxial growth is accordingly preferred.

Reference is now made to FIGS. 13-28 which illustrate the process steps in the formation of fins for a FinFET device on a Silicon-on-Insulator (SOI) substrate.

Figure 13:
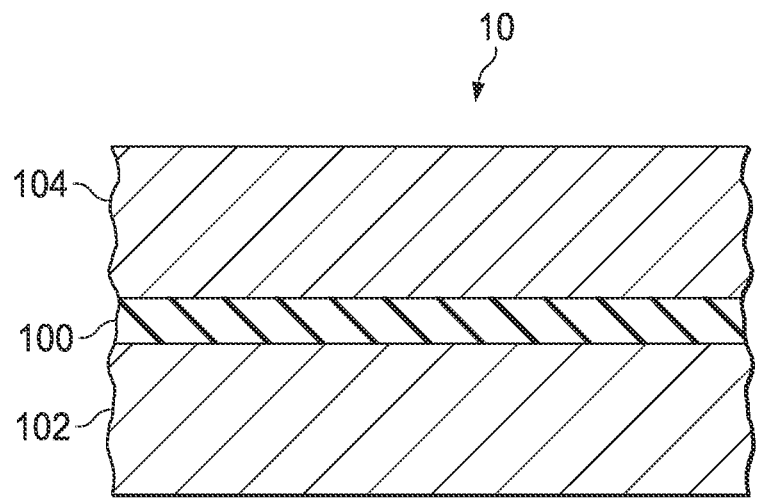
FIGS. 13-28 illustrate process steps in the formation of fins for a FinFET device on a Silicon-on-Insulator (SOI) substrate.

FIG. 13 shows a conventional silicon-on-insulator (SOI) substrate 10 formed by insulator layer 100 of silicon dioxide formed on a first silicon (Si) layer 102. A second silicon (Si) layer 104 is formed over the insulator layer 100. In a preferred implementation, the SOI substrate 10 is of the partially-depleted (PD) type (i.e., the substrate 10 comprises PD SOI as known in the art). The first and second silicon layers 102 and 104 may be doped as needed for the integrated circuit application. The thickness of the first and second silicon layers 102 and 104 may be tuned (for example, through the use of a thinning operation) as needed for the integrated circuit application. In a preferred implementation, the second silicon (Si) layer 104 has a thickness of about 20-40 nm, and more particularly about 30 nm, which is the preferred height of the fin structures being formed for FinFET devices. Although a PD SOI is preferred, it will be understood that other types of SOI substrates, including fully depleted (FD), could instead be used. Still further, the substrate may alternatively comprise a non-SOI substrate.

Figure 14:
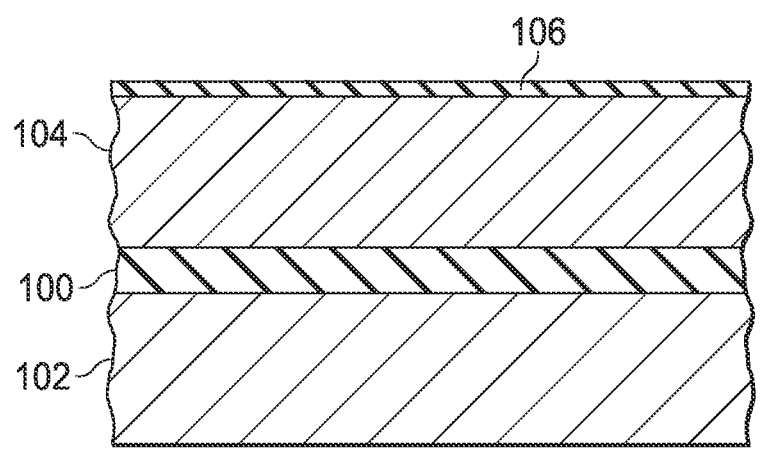

FIG. 14 shows the deposit of a silicon dioxide (SiO$_2$) layer 106 over the second silicon (Si) layer 104.

Figure 15:
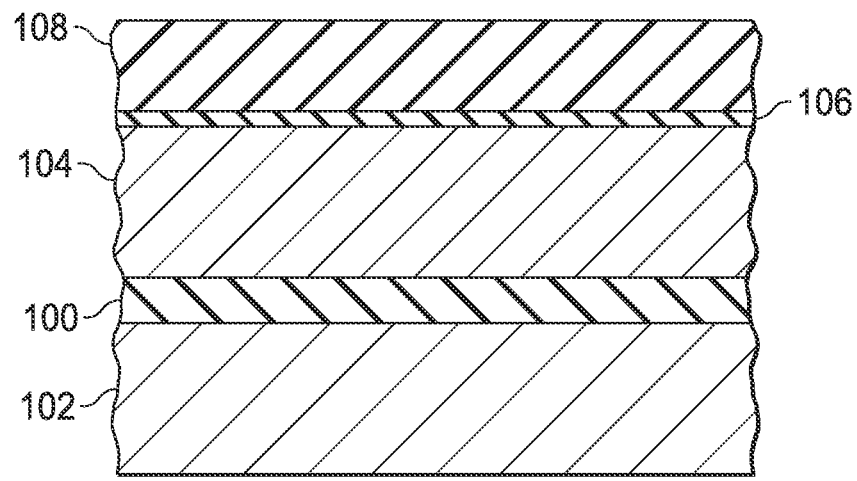

FIG. 15 shows the deposit of a silicon nitride (SiN) layer 108 over the silicon dioxide layer 106.

Figure 16:
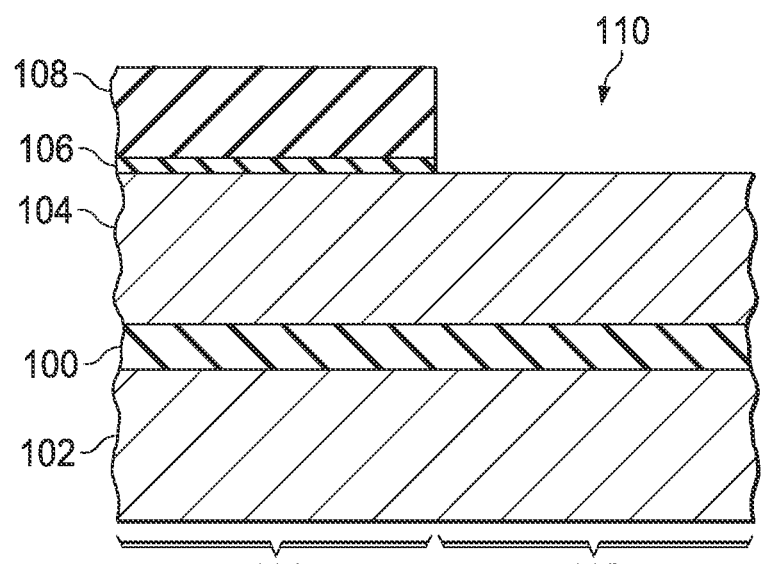

A lithographic process as known in the art is then used to form an opening 110 in the silicon nitride layer 108 and silicon dioxide layer 106 (a SiN/SiO$_2$ hard mask) which extends down to reach at least the top surface of the second silicon (Si) layer 104. The result of the lithographic process is shown in FIG. 16. The opening 110 is associated with a region 112 of the substrate reserved for the formation of p-channel FinFET devices. The region 114 of the substrate is conversely reserved for the formation of n-channel FinFET devices. Thus, the process described and illustrated primarily concerns the formation of CMOS type integrated circuits, although it will be understood that this is not the only application of the described process. In plan view, the opening 110 may take on any desired shape governed by the size and number of p-channel devices to be formed within the region 112.

Figure 17:
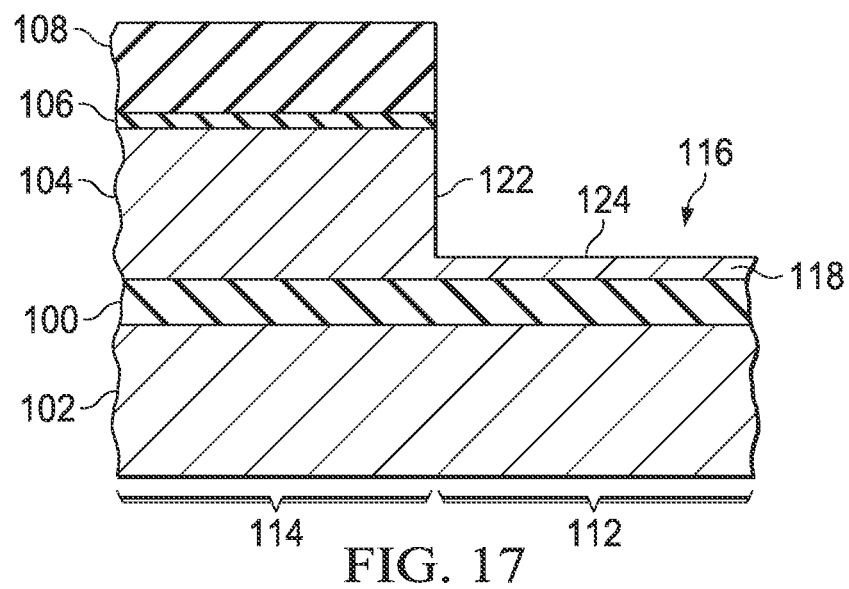

Using an epitaxial process tool, a high pressure directional etch process as known in the art is then performed to remove a portion 116 of the second silicon (Si) layer 104 within the region 112. In an embodiment, the directional etch may comprise a high pressure HCl etch. The result of the directional etch process is shown in FIG. 17. It will be noted that a portion 118 of the second silicon (Si) layer 104 remains in the region 112 after the directional etch is completed. The thickness of the remaining Si portion 118 in region 112 is about 5 nm to 15 nm.

Figure 18:
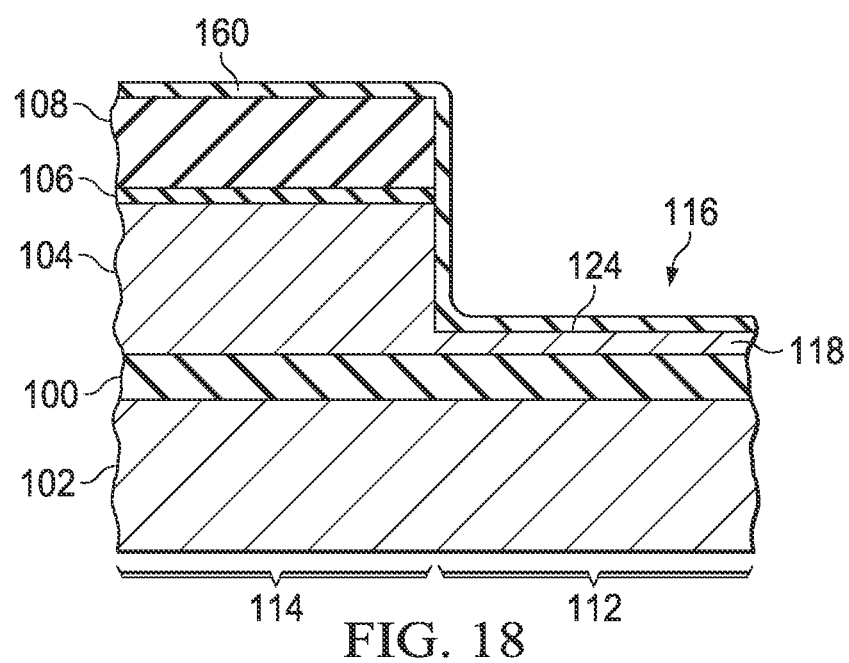

FIG. 18 shows the deposit of a silicon dioxide ($SiO_2$) layer 160 over the second silicon (Si) layer 104. The silicon dioxide ($SiO_2$) layer 160 is conformal and thus covers the silicon nitride (SiN) layer 108 and the surfaces 122 and 124 of the second silicon (Si) layer 104.

Figure 19:
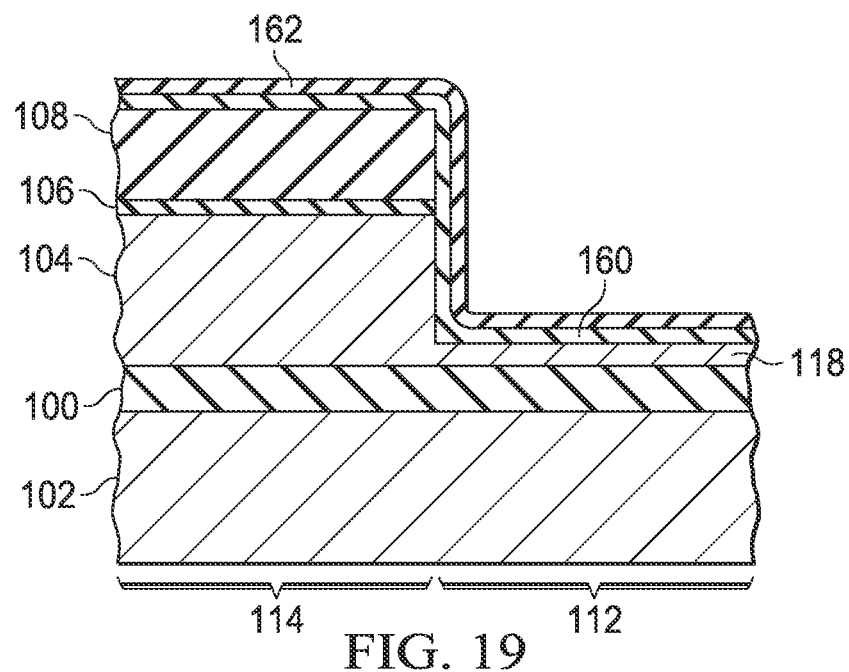

FIG. 19 shows the deposit of a silicon nitride (SiN) layer 162 over the silicon dioxide layer 160. The silicon nitride (SiN) layer 162 is also conformal.

Figure 20:
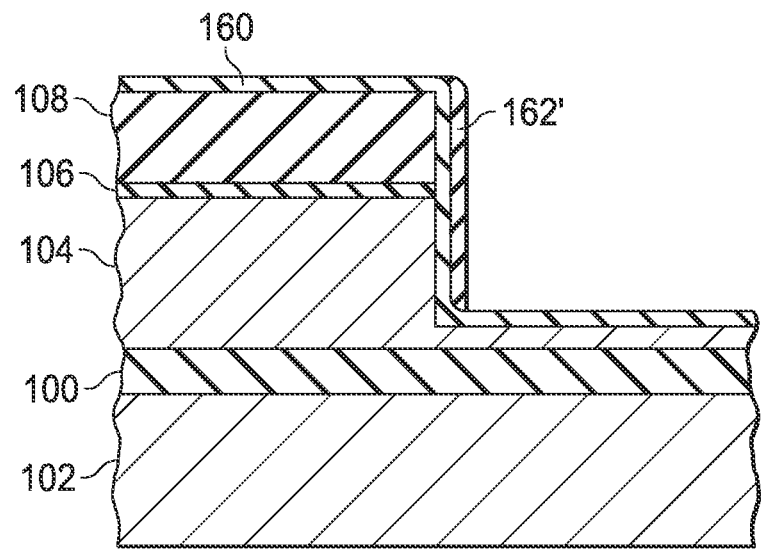

An etch process as known in the art is then performed to remove the horizontal portions of the silicon nitride (SiN) layer 162. The result of the etch process is shown in FIG. 20. In a preferred embodiment, the etch process may comprise a $NF_3$ etch. This will leave a vertical portion 162' of the silicon nitride (SiN) layer 162 in place on the sidewalls of the silicon nitride (SiN) layer 162.

Figure 21:
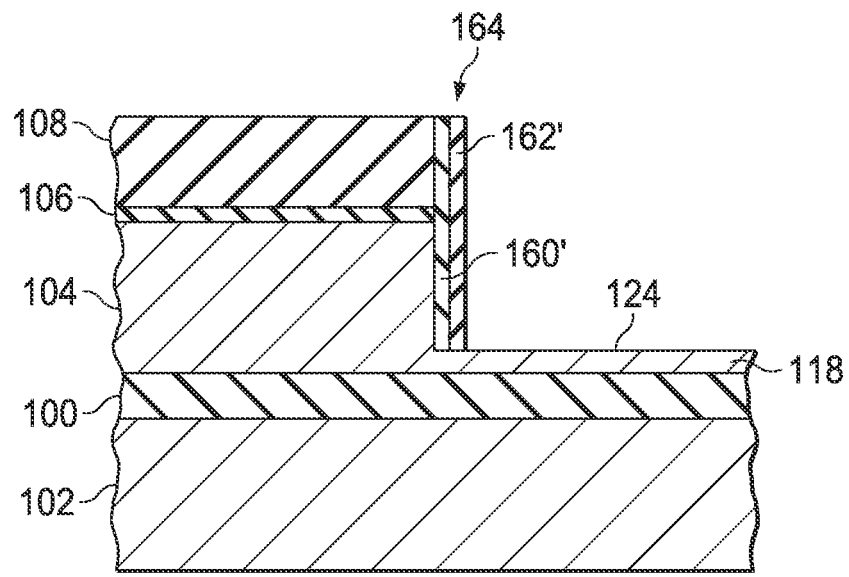

An etch process as known in the art is then performed to remove the horizontal portions of the silicon dioxide ($SiO_2$) layer 160. The result of the etch process is shown in FIG. 21. In a preferred embodiment, the etch process may comprise an HF etch. This will leave a vertical portion 160' of the silicon dioxide ($SiO_2$) layer 160 and the vertical portion 162' of the silicon nitride (SiN) layer 162 in place to define a sidewall spacer 164.

Figure 22:
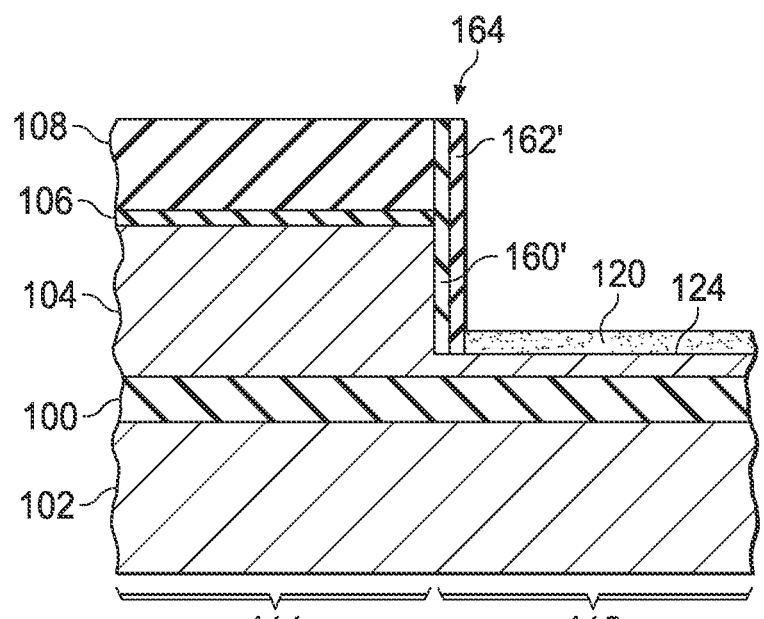

An epitaxial growth process as known in the art is then performed to grow a silicon-germanium (SiGe) layer 120 on the exposed surface 124 of the second silicon (Si) layer 104. The result of the epitaxial growth process is shown in FIG. 22. The stippling in FIG. 22 is provided to differentiate SiGe material from Si material. The thickness of the silicon-germanium (SiGe) layer 120 in region 112 is about 6 nm to 8 nm.

Figure 23:
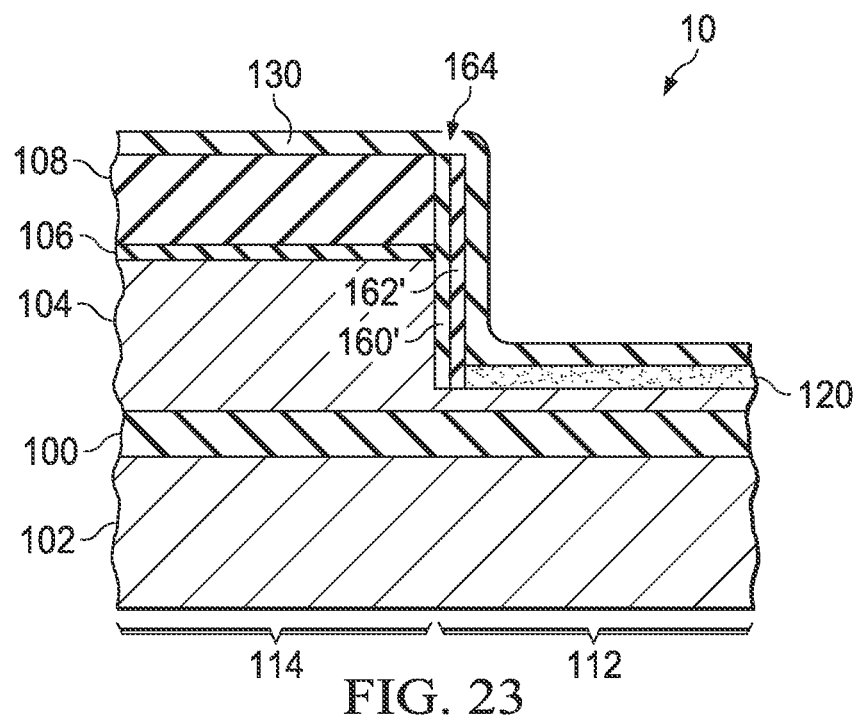

FIG. 23 shows the deposit of a silicon dioxide ($SiO_2$) layer 130 over the substrate 10. The silicon dioxide ($SiO_2$) layer 130 is conformally deposited and thus covers the top of the $SiN/SiO_2$ hard mask, the side of the spacer 164 and the silicon-germanium (SiGe) layer 120 within region 112.

Figure 24:
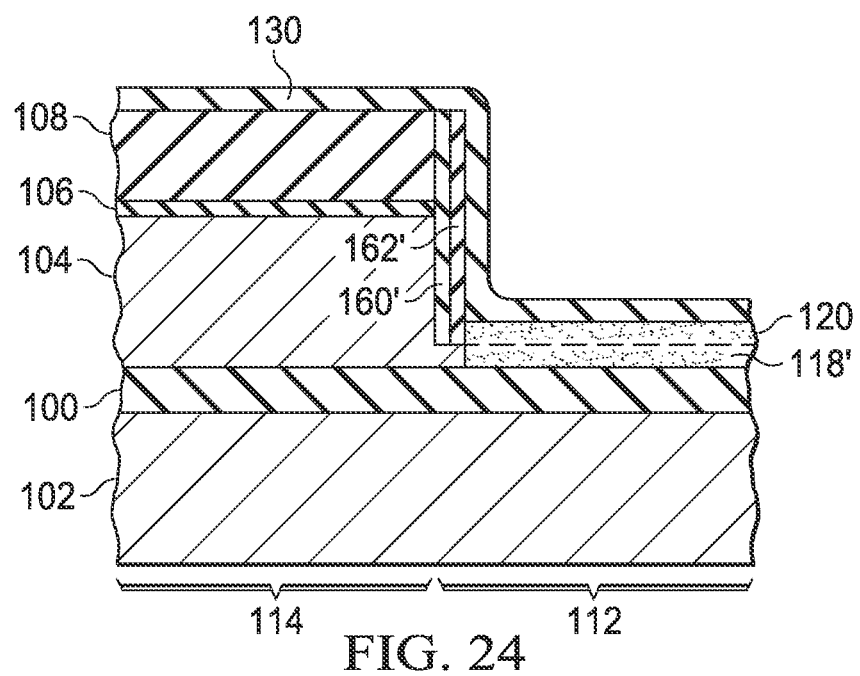

Next, a condensation operation, for example of the rapid thermal oxidation (RTO) type, is performed to drive the Ge from the silicon-germanium (SiGe) layer 120 into the second silicon (Si) layer 104. In particular, the drive-in converts the portion 118 of the second silicon (Si) layer 104 which remained in the region 112 into a SiGe region 118'. The result of the drive-in process is shown in FIG. 24. Again, the stippling in FIG. 24 is provided to differentiate SiGe material from Si material. The dotted line in FIG. 24 is provided to illustrate the previous location of the surface 124 in relation to the formed SiGe region 118'.

As an alternative to performing the condensation operation for drive-in, a higher temperature anneal process may be performed to cause a mixing of the SiGe material of the silicon-germanium (SiGe) layer 120 with the portion 118 of the second silicon (Si) layer 104 which remained in the region 112.

With either process technique of condensation or anneal used for drive-in, it will be noted that only a small thickness (approximately 6-8 nm) of the second silicon (Si) layer 104 within the portion 118 needs to be changed from Si to SiGe. Thus, the thermal budget for this vertical diffusion processing operation is relatively limited.

The spacer 164 functions as a barrier to lateral diffusion of germanium into the second silicon (Si) layer 104 of the region 114.

Figure 25:
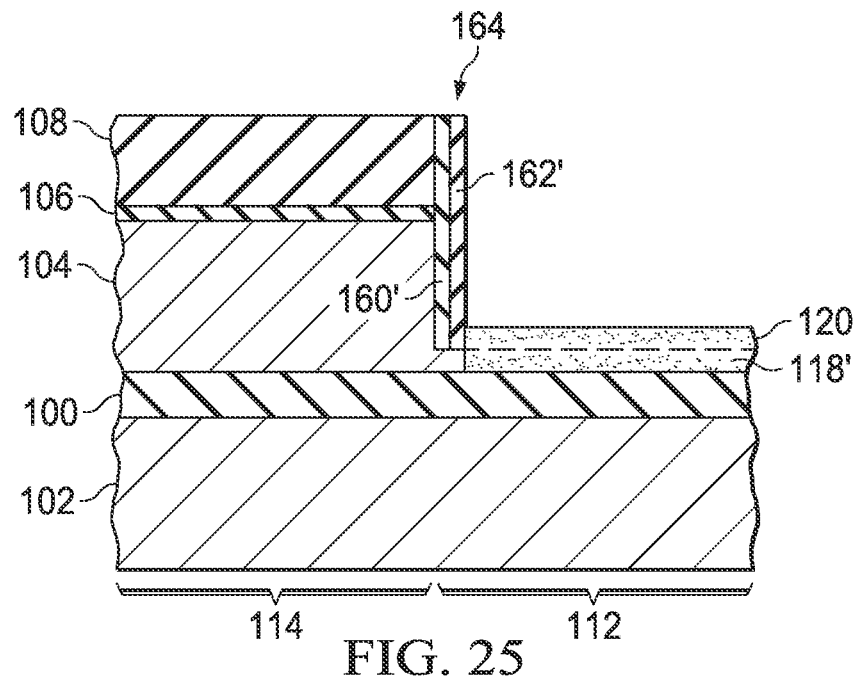

The silicon dioxide ($SiO_2$) layer 130 is then removed as shown in FIG. 25.

Figure 26:
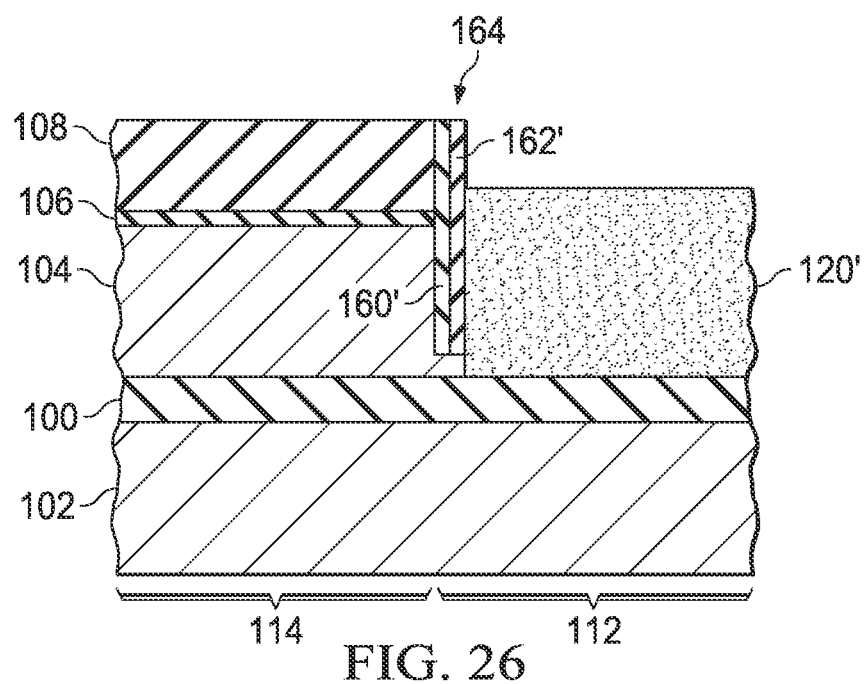

An epitaxial growth process as known in the art is then performed to grow a silicon-germanium (SiGe) region 120' from the SiGe material defined by the silicon-germanium (SiGe) layer 120 and SiGe region 118'. The result of the epitaxial growth process is shown in FIG. 26. Again, the stippling in FIG. 26 is provided to differentiate SiGe material from Si material. The epitaxial growth of SiGe region 120' in region 112 preferably achieves a depth equal to or exceeding the depth of the second silicon (Si) layer 104 in region 114. In a preferred implementation, a SiGe epitaxial growth of more than 20 nm is effectuated.

Figure 27:
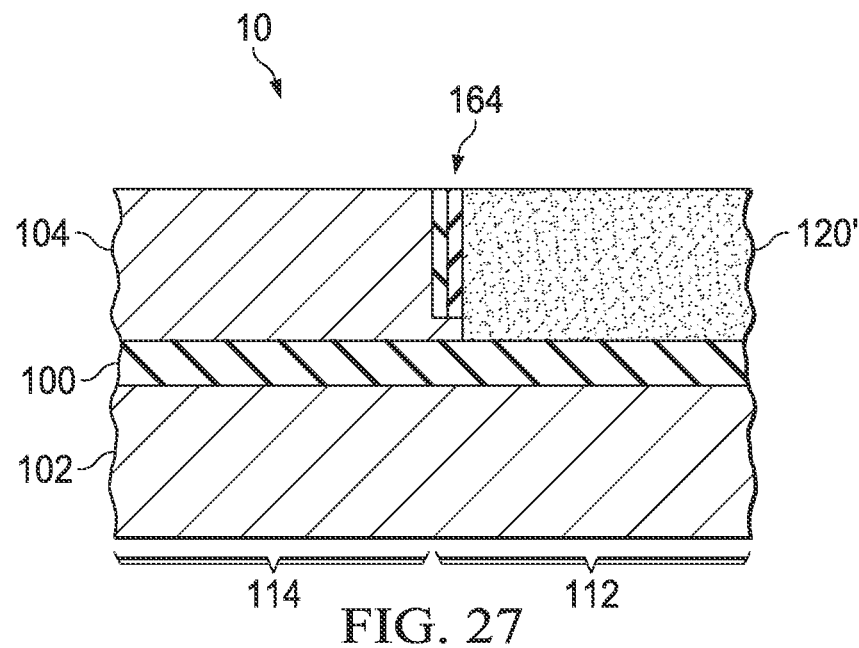

The $SiN/SiO_2$ hard mask is then removed and a planarization process (for example, chemical-mechanical polishing (CMP)), is used to flatten the top of the substrate 10 so as to equalize the depth of the silicon-germanium (SiGe) region 120' in region 112 and the depth of the second silicon (Si) layer 104 in region 114. This is shown in FIG. 27. The spacer 164 remains in place separating the silicon-germanium (SiGe) region 120' in region 112 from the second silicon (Si) layer 104 in region 114.

As an alternative, a well-defined thinner hardmask may be used with the thinner hardmask functioning as a stop layer for the CMP process. To support equalized depths in the first and second regions 112 and 114, a hot SC1 clean is performed to accurately remove some SiGe (for the depth of the thinner hardmask). The hardmask is then removed.

Figure 28:
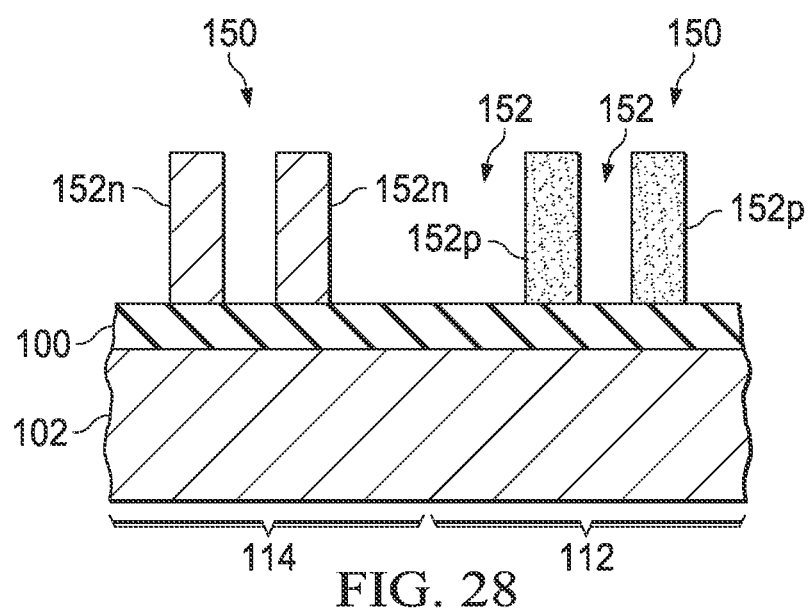

A lithographic process as known in the art is then used to define the fins 150 for the FinFET devices. A lithographic mask is applied over the top surface of the silicon-germanium (SiGe) region 120' in region 112 and the second silicon (Si) layer 104 in region 114. The mask is patterned to leave mask material at the desired locations of the fins 150. An etching operation is then performed to open apertures 152 in the silicon-germanium (SiGe) region 120' in region 112 and the second silicon (Si) layer 104 in region 114 on either side of each fin 150. The result of the etching process is shown in FIG. 28. Again, the stippling in FIG. 28 is provided to differentiate SiGe material from Si material. The fins 150 include fins 152p for use in forming p-channel transistors in the region 112 fins and 152n for use in forming n-channel transistors in the region 114. The etching process used to form the fins 150 may, for example, comprise a $Cl_2$ or HBr etch as known in the art.

It is preferred to perform SiGe epitaxial growth in two steps (FIG. 22 and FIG. 26) separated by the drive-in of Ge (FIG. 24) because this process produces a fin 150p structure having a full and uniform SiGe material configuration.

Notwithstanding the foregoing, it will be understood that that SiGe epitaxial growth of FIG. 22 may be performed to a degree which grows SiGe material in region 112 to height at or exceeding the height of the second silicon (Si) layer 104 in region 114. This would optionally be followed by the deposit of a silicon dioxide ($SiO_2$) layer 130 (compare to FIG. 23) and a subsequent drive-in process (FIG. 24), and thus the SiGe growth step of FIG. 26 would not be performed. The potential problem with this alternate process is a non-uniformity in semiconductor material within the fin 150p caused by the presence of both Si and SiGe in region 112. Such a non-uniformity in semiconductor material with respect to the fin 150p will degrade p-channel transistor performance and introduce variabilities in transistor threshold. Additionally, because there is a lattice mismatch between Si and SiGe, the growth of a thick SiGe layer on top of Si can create dislocations at the bottom of the fin 150p, which may lead to leakage paths. Conversion of the portion 118 of the second silicon (Si) layer 104 remaining in the region 112 into a SiGe region 118' before thick SiGe epitaxial growth is accordingly preferred.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
in a substrate layer formed of a first semiconductor material and having a first region which is adjacent to a second region, removing a portion of first semiconductor material of the substrate layer in the second region, said second region retaining a bottom portion made of said first semiconductor material;
epitaxially growing a second semiconductor material covering the bottom portion;
converting the bottom portion made of said first semiconductor material into said second semiconductor material so that the first region is defined by the first semiconductor material and second region is defined by the second semiconductor material;
patterning the first semiconductor material in the first region to define a first fin structure of a FinFET transistor of a first conductivity type; and
patterning the second semiconductor material in the second region to define a second fin structure of a FinFET transistor of a second conductivity type.

2. The method of claim 1, wherein the substrate layer is a top semiconductor layer of a silicon-on-insulator (SOI) substrate.

3. The method of claim 1, further comprising epitaxially growing the second semiconductor material on the converted bottom portion so that the second semiconductor material in the second region is at least as high as the first semiconductor material in the first region.

4. The method of claim 3, further comprising planarizing a top surface to provide first semiconductor material in the first region and second semiconductor material in the second region at a same height.

5. The method of claim 1, wherein removing the portion of first semiconductor material of the substrate layer in the second region defines a side wall, the method further comprising forming a spacer on said side wall, wherein said spacer separates the second semiconductor material in the second region from the first semiconductor material in the first region.

6. The method of claim 5, wherein forming the spacer comprises forming an oxide layer on the side wall and forming a nitride layer on the oxide layer.

7. The method of claim 1, wherein the first semiconductor material is silicon and the second semiconductor material is silicon-germanium.

8. The method of claim 7, wherein converting comprises driving germanium from the silicon-germanium epitaxially grown second semiconductor material into the silicon first semiconductor material of the bottom portion.

9. The method of claim 7, wherein the FinFET transistor of the first conductivity type formed of the first semiconductor material is an n-channel device and wherein the FinFET transistor of the second conductivity type formed of the second semiconductor material is a p-channel device.

10. A method, comprising:
in a substrate layer formed of a first semiconductor material and having a first region which is adjacent to a second region, removing a portion of first semiconductor material of the substrate layer in the second region to define a side wall, said second region retaining a bottom portion made of said first semiconductor material;
first epitaxially growing a second semiconductor material covering the side wall and the bottom portion in the second region;
conformally depositing an oxide layer over the second semiconductor material;
applying a thermal treatment to convert the first semiconductor material at the side wall and bottom portion to the second semiconductor material;
removing the oxide layer;
second epitaxially growing the second semiconductor material in the second region from the first epitaxially grown second semiconductor material and converted bottom portion so that the first region is defined by the first semiconductor material and second region is defined by the second semiconductor material;
patterning the first semiconductor material in the first region to define a first fin structure of a FinFET transistor of a first conductivity type; and
patterning the second semiconductor material in the second region to define a second fin structure of a FinFET transistor of a second conductivity type.

11. The method of claim 10, wherein the substrate layer is a top semiconductor layer of a silicon-on-insulator (SOI) substrate.

12. The method of claim 10, further comprising planarizing a top surface to provide first semiconductor material in the first region and second semiconductor material in the second region at a same height.

13. The method of claim 10, wherein the first semiconductor material is silicon and the second semiconductor material is silicon-germanium.

14. The method of claim 13, wherein applying the thermal treatment comprises driving germanium from the first epitaxially grown second semiconductor material into the silicon first semiconductor material of the bottom portion.

15. The method of claim 13, wherein the FinFET transistor of the first conductivity type formed of the first semiconductor material is an n-channel device and wherein the FinFET transistor of the second conductivity type formed of the second semiconductor material is a p-channel device.

16. A method, comprising:
in a substrate layer formed of a first semiconductor material and having a first region which is adjacent to a second region, removing a portion of first semiconductor material of the substrate layer in the second region to define a side wall, said second region retaining a bottom portion made of said first semiconductor material;
forming a spacer on said side wall;
first epitaxially growing a second semiconductor material on the bottom portion in the second region;
conformally depositing an oxide layer over the second semiconductor material;
applying a thermal treatment to convert the first semiconductor material of the bottom portion to the second semiconductor material;

removing the oxide layer;
second epitaxially growing the second semiconductor material in the second region from the first epitaxially grown second semiconductor material and converted bottom portion so that the first region is defined by the first semiconductor material and second region is defined by the second semiconductor material, and wherein said spacer separates the second semiconductor material in the second region from the first semiconductor material in the first region;
patterning the first semiconductor material in the first region to define a first fin structure of a FinFET transistor of a first conductivity type; and
patterning the second semiconductor material in the second region to define a second fin structure of a FinFET transistor of a second conductivity type.

17. The method of claim 16, wherein the substrate layer is a top semiconductor layer of a silicon-on-insulator (SOI) substrate.

18. The method of claim 16, wherein forming the spacer comprises forming an oxide layer on the side wall and forming a nitride layer on the oxide layer.

19. The method of claim 16, further comprising planarizing a top surface to provide first semiconductor material in the first region and second semiconductor material in the second region at a same height.

20. The method of claim 16, wherein the first semiconductor material is silicon and the second semiconductor material is silicon-germanium.

21. The method of claim 20, wherein applying the thermal treatment comprises driving germanium from the first epitaxially grown second semiconductor material into the silicon first semiconductor material of the bottom portion.

22. The method of claim 20, wherein the FinFET transistor of the first conductivity type formed of the first semiconductor material is an n-channel device and wherein the FinFET transistor of the second conductivity type formed of the second semiconductor material is a p-channel device.

* * * * *